US 12,535,747 B2

(12) United States Patent
Sugimoto et al.

(10) Patent No.: US 12,535,747 B2
(45) Date of Patent: Jan. 27, 2026

(54) ANALYZING METHOD, ANALYSIS APPARATUS, MEASURING METHOD, MEASUREMENT APPARATUS, EXPOSING METHOD, AND EXPOSURE APPARATUS

(71) Applicant: NIKON CORPORATION, Tokyo (JP)

(72) Inventors: Ayako Sugimoto, Kumagaya (JP); Ryugo Iida, Chofu (JP); Shinji Wakamoto, Saitama (JP)

(73) Assignee: NIKON CORPORATION, Tokyo (JP)

( * ) Notice: Subject to any disclaimer, the term of this patent is extended or adjusted under 35 U.S.C. 154(b) by 137 days.

(21) Appl. No.: 18/382,256

(22) Filed: Oct. 20, 2023

(65) Prior Publication Data

US 2024/0045348 A1    Feb. 8, 2024

Related U.S. Application Data

(63) Continuation of application No. PCT/JP2022/017371, filed on Apr. 8, 2022.

(30) Foreign Application Priority Data

Apr. 23, 2021 (JP) ................................. 2021-073425

(51) Int. Cl.
*G03F 9/00* (2006.01)
*G03F 7/00* (2006.01)

(52) U.S. Cl.
CPC ........ *G03F 9/7088* (2013.01); *G03F 7/70341* (2013.01); *G03F 7/70775* (2013.01); *G03F 9/7003* (2013.01)

(58) Field of Classification Search
CPC ............... G03F 9/7088; G03F 7/70341; G03F 7/70775; G03F 9/7003; G03F 7/70783; G03F 7/20; G03F 7/707; G03F 7/70725; G03F 7/70733; G03F 7/7085; G03F 9/7046; G01B 21/32; G01B 21/04
See application file for complete search history.

(56) References Cited

U.S. PATENT DOCUMENTS

2003/0215965 A1    11/2003    Grodnensky et al.
2013/0041494 A1    2/2013    Ausschnitt et al.
(Continued)

FOREIGN PATENT DOCUMENTS

JP    2017-506741 A    3/2017
JP    2017-524960 A    8/2017
(Continued)

OTHER PUBLICATIONS

Jun. 11, 2024 Office Action Issued in Japanese Patent Application No. 2023-516441.
(Continued)

*Primary Examiner* — Tony Ko
(74) *Attorney, Agent, or Firm* — Oliff PLC

(57) ABSTRACT

An analyzing method includes preparing measured position information that is position information of a plurality of measured-parts formed on a substrate, and fitting a reference function, which is a sum of at least one function obtained by multiplying a criterion function expressed using a first type Bessel function by a proportional coefficient, to the measured position information and calculating an optimum value of at least one of the proportional coefficient.

21 Claims, 8 Drawing Sheets

(56) References Cited

U.S. PATENT DOCUMENTS

2017/0108783 A1    4/2017  Kramer et al.
2019/0094712 A1    3/2019  Smilde et al.
2019/0257647 A1    8/2019  Ichinose et al.
2020/0081356 A1    3/2020  Tinnemans et al.
2022/0334493 A1*  10/2022  Liu .................... G03F 7/70441

FOREIGN PATENT DOCUMENTS

KR    10-2019-0040279 A    4/2019
WO       2015/189001 A1   12/2015

OTHER PUBLICATIONS

Jun. 28, 2022 International Search Report issued in International Patent Application No. PCT/JP2022/017371.
Jun. 28, 2022 Written Opinion issued in International Patent Application No. PCT/JP2022/017371.
Kikuchi et al. "Novel overlay correction using inline alignment station(iAS) for scanner", Optical Microlithography XXXIII, Mar. 23, 2020, pp. 1-5, XP093283935, DOI: 10.1117/12.2551973 ISBN: 978-1-5106-3422-0.
Jun. 24, 2025 European Search Report issued in European Patent Application No. 22791619.4.
Sep. 9, 2025 Office Action issued in Taiwanese Patent Application No. 111113847.
Nov. 12, 2025 Office Action issued in Korean Patent Application No. 10-2023-7035768.

* cited by examiner $\mu_{mk}$

| m \ k | 1 | 2 | 3 | 4 | 5 | 6 | 7 |
|---|---|---|---|---|---|---|---|
| 0 | — | 3.83171 | 7.01559 | 10.17347 | 13.32369 | 16.47063 | 19.61586 |
| 1 | 1.84118 | 5.33144 | 8.53632 | 11.70601 | 14.86359 | 18.01553 | |
| 2 | 3.05424 | 6.70613 | 9.96947 | 13.17037 | 16.34752 | | |
| 3 | 4.20119 | 8.01525 | 11.34593 | 14.58585 | | | |
| 4 | 5.31755 | 9.28239 | 12.68191 | | | | |
| 5 | 6.41562 | 10.51986 | | | | | |
| 6 | 7.50127 | | | | | | |
| 7 | 8.57784 | | | | | | |

$\lambda_{mk}$

| m \ k | 1 | 2 | 3 | 4 | 5 | 6 | 7 |
|---|---|---|---|---|---|---|---|
| 0 | 2.40483 | 5.52008 | 8.65373 | 11.79153 | 14.93092 | 18.07106 | 21.21164 |
| 1 | 3.83171 | 7.01559 | 10.17347 | 13.32369 | 16.47063 | 19.61586 | |
| 2 | 5.13562 | 8.41725 | 11.61984 | 14.79595 | 17.95982 | | |
| 3 | 6.38016 | 9.76102 | 13.01520 | 16.22347 | | | |
| 4 | 7.58834 | 11.06471 | 14.37254 | | | | |
| 5 | 8.77148 | 12.33860 | | | | | |
| 6 | 9.93611 | | | | | | |
| 7 | 11.08637 | | | | | | |

ANALYZING METHOD, ANALYSIS APPARATUS, MEASURING METHOD, MEASUREMENT APPARATUS, EXPOSING METHOD, AND EXPOSURE APPARATUS

CROSS-REFERENCE TO RELATED APPLICATION

Priority is claimed on Japanese Patent Application No. 2021-073425, filed on Apr. 23, 2021. The present application is a continuation application of International Application PCT/JP2022/017371, filed on Apr. 8, 2022. The contents of the above applications are incorporated herein.

BACKGROUND

Technical Field

The present invention relates to an analyzing method, an analysis apparatus, a measuring method, a measurement apparatus, an exposing method, and an exposure apparatus.

In a lithography technology used in manufacturing of a semiconductor integrated circuit or the like, patterns are formed through overlaying different patterns on a conventional pattern formed on a substrate. In the lithography process, not only linear deformation, which is uniform expansion and contraction proportional to a position within the substrate, but also non-linear deformation, which is not proportional to the position within the substrate, may occur in the substrate. As a method of expressing non-linear deformation on a substrate, for example, a method disclosed in PCT International Publication No. 2015/189001 is provided.

SUMMARY

According to a first aspect, an analyzing method includes preparing measured position information that is position information of a plurality of measured-parts formed on a substrate; and fitting a reference function, which is a sum of at least one function obtained by multiplying a criterion function expressed using a first type Bessel function by a proportional coefficient, to the measured position information and calculating an optimum value of at least one of the proportional coefficient.

According to a second aspect, an analysis apparatus includes an input part configured to input measured position information that is position information of a plurality of measured-parts formed on a substrate; an analysis part configured to analyze the measured position information of the measured-part that has been measured by a position measurement part; and an output part configured to output an analysis result including at least a calculated optimum value of a proportional coefficient to external equipment, the analysis part calculating an optimum value of at least one of the proportional coefficient using the analyzing method according to the first aspect.

According to a third aspect, a measuring method includes measuring positions of a plurality of measured-parts formed on a substrate and obtaining measured position information of the measured-parts; and calculating an optimum value of at least one of the proportional coefficient using the analyzing method according to the first aspect.

According to a fourth aspect, a measurement apparatus includes a position measurement part configured to measure a position of a measured-part formed on a substrate; and an analysis part configured to analyze measured position information of the measured-part that is measured by the position measurement part, the analysis part calculating an optimum value of at least one of the proportional coefficient using the analyzing method according to the first aspect.

According to a fifth aspect, an exposing method includes measuring positions of the plurality of measured-parts on the substrate on which the first pattern is formed with a predetermined positional relation with respect to the measured-part using the measuring method according to the second aspect, acquiring measured position information of the measured-part and calculating an optimum value of at least one of the proportional coefficient; estimating a position of a first pattern formed on the substrate with a predetermined positional relation with respect to the plurality of measured-parts based on the acquired measured position information and the optimum value of at least one of the proportional coefficient; and exposing a second pattern on the substrate based on the estimated position of the first pattern.

According to a sixth aspect, an exposure apparatus includes a position measurement part configured to measure a position of a measured-part formed on a substrate; and an exposure optical system configured to expose a desired pattern on the substrate, and performing the exposing method according to the fourth aspect.

According to a seventh aspect, an exposure apparatus includes a stage configured to have placed thereon and move a substrate on which a measured-part is formed; and a substrate conveyance device configured to convey the substrate and place the substrate on the stage, and the exposure apparatus exposes a desired pattern on the substrate, a device constant that defines an operation of the substrate conveyance device is determined based on a measurement result obtained by the measuring method according to the second aspect.

DESCRIPTION OF THE EMBODIMENTS (Measurement Apparatus and Exposure Apparatus of Embodiment)

Figure 1:
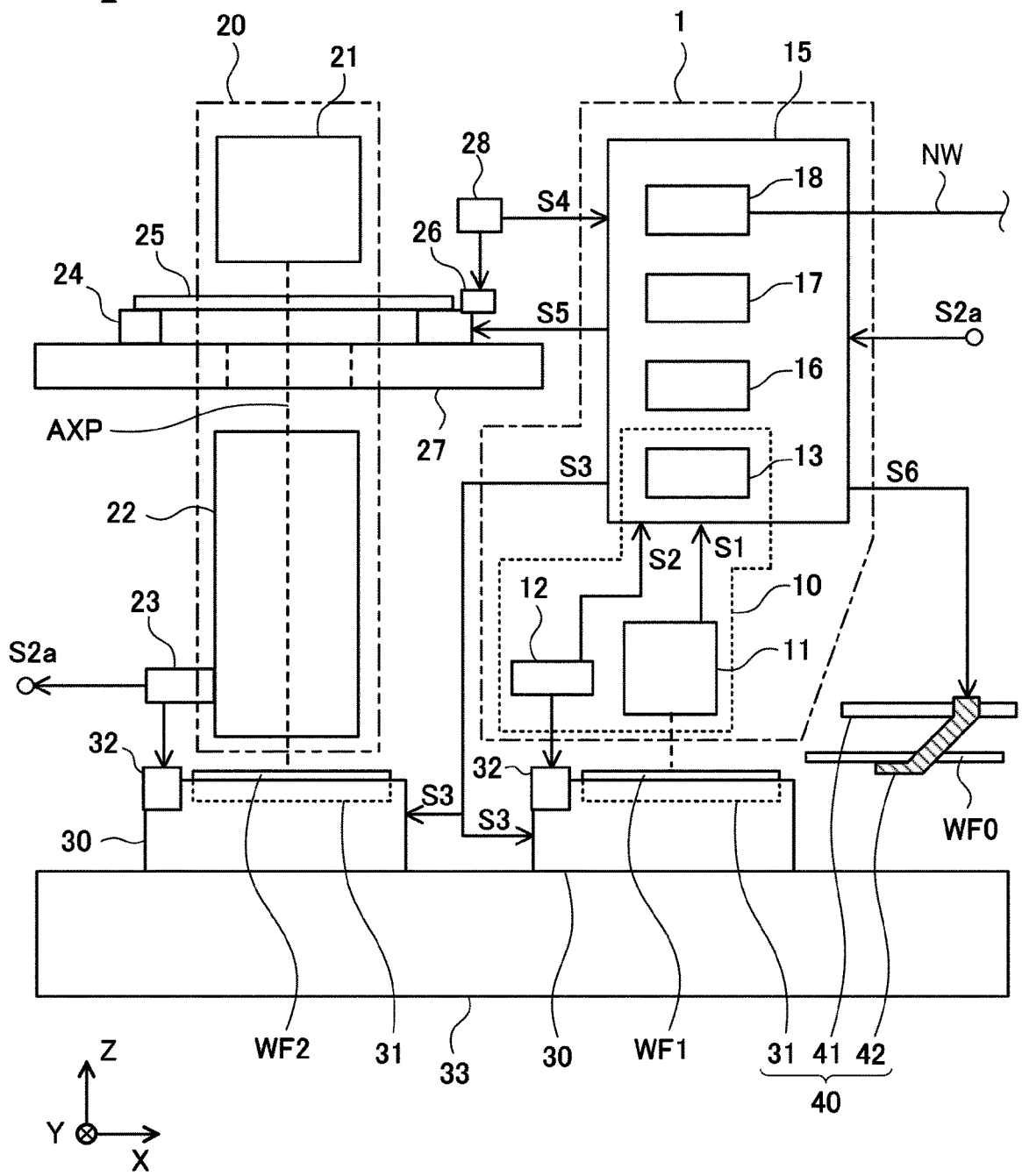
FIG. 1 is a schematic view showing a configuration of a measurement apparatus and an exposure apparatus of an embodiment.

FIG. 1 is a view schematically showing a configuration of a measurement apparatus 1 and an exposure apparatus 2 of an embodiment. The exposure apparatus 2 includes the measurement apparatus 1 of the embodiment surrounded by a dashed line in FIG. 1.

Further, the measurement apparatus 1 of the embodiment may be a part of a configuration of the exposure apparatus 2 as shown in FIG. 1, and may be a device independent from the exposure apparatus 2. Hereinafter, the measurement apparatus 1 will be described as a part of the configuration of the exposure apparatus 2.

An X direction, a Y direction and a Z direction are perpendicular to each other and shown by arrows in FIG. 1 and the following drawings, and each of the X direction, the Y direction and the Z direction indicates the same direction in each drawing.

Hereinafter, directions shown by arrows are referred to as a +X direction, a +Y direction and a +Z direction, respectively.

In addition, a position in the X direction is referred to as an X position, and a position in the Y direction is referred to as a Y position.

The exposure apparatus 2 is a device configured to expose and transfer a predetermined pattern to a surface of a substrate WF. The exposure apparatus 2 includes an exposure optical system 20 surrounded by a two-dot dashed line in FIG. 1, a stage 30 on which the substrate WF is placed, a mask stage 24 on which a mask 25 that is an original plate of a pattern exposed on the substrate WF is placed, and the like, in addition to the measurement apparatus 1. Further, FIG. 1 shows two stages 30 in which the positional relations in the X direction are interchanged, but there may be only one stage 30.

The exposure optical system 20 includes an illumination optical system 21 and a projection optical system 22. The illumination optical system 21 irradiates the mask 25 with illumination light, and the projection optical system 22 exposes the substrate WF with exposure light that passes through the mask 25 and is given a light and shade pattern. Further, the mask 25 is not limited to a transmissive mask and may be a reflective mask.

The stage 30 includes a drive mechanism such as a linear motor or the like, and can move on a guide 33 in the X direction and the Y direction and move by a micro distance (for example, about several millimeters) in the Z direction. A position of the stage 30 is measured as a position of an encoder plate 32 provided on the stage 30 by an encoder head 23 provided to hold a predetermined positional relation with respect to the projection optical system 22, and output as a signal S2a.

The mask stage 24 includes a drive mechanism such as a linear motor or the like, and can move on a mask guide 27 in the Y direction and move by a micro distance (for example, about several millimeters) in the X direction and the Z direction. A position of the mask stage 24 is measured as a position of an encoder plate 26 provided on the mask stage 24 by an encoder head 28 provided to hold a predetermined positional relation with respect to the projection optical system 22, and output as a signal S4.

The exposure apparatus 2 is, for example, a scanning type exposure apparatus configured to perform exposure to the substrate WF while relatively scanning the stage 30 on which the substrate WF is placed and the mask stage 24 on which the mask 25 is placed with respect to the projection optical system 22 in the Y direction.

However, the exposure apparatus 2 may be a step-and-repeat type exposure apparatus configured to perform exposure in a state in which the stage 30 on which the substrate WF is placed and the mask stage 24 on which the mask 25 is placed are stationary with respect to the projection optical system 22.

A measures configured to measure positions of the stage 30 and the mask stage 24 is not limited to the above-mentioned encoder system, and may use a laser interferometer or a magnetic scale.

The stage 30 has a substrate chuck part 31 in a portion on which the substrate WF is placed. The substrate chuck part 31 sucks the substrate WF using a so-called vacuum chuck or electrostatic chuck.

The substrate WF exposed by the exposure apparatus 2 includes an electronic material such as a semiconductor or the like, a conventional pattern formed by the previous exposure process is present in the vicinity of a surface thereof (a surface on the +Z side), and a photosensitive material (not shown) is formed on the surface of the substrate WF.

Figure 2A:
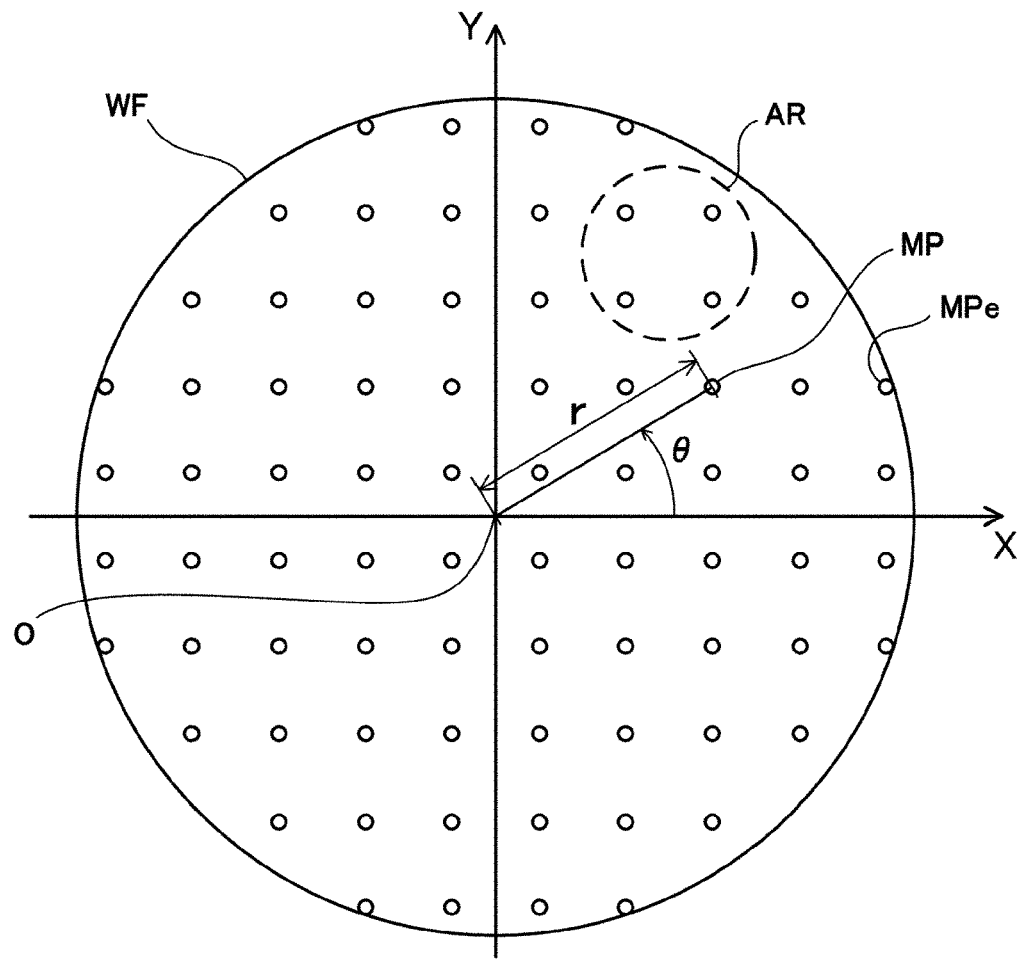
FIG. 2A is a view showing an example of a substrate.

FIG. 2A is a view showing an example of the substrate WF when the substrate WF is seen in the +Z direction. A plurality of predetermined measured-parts MP such as alignment marks for position measurement or the like are formed at positions having predetermined positional relations with respect to a conventional pattern on the substrate WF as a part of the conventional pattern (not shown). The measured-part MP is not limited to a dedicated pattern provided for measurement of a position, but may be a part of a circuit pattern that constitutes an electronic circuit formed on the substrate WF.

An origin O shown in FIG. 2A is a center point such as a center of gravity or the like of the circular substrate WF as an example, an X axis indicates an axis extending in the X direction through the origin O, and an Y axis indicates an axis extending in the Y direction through the origin O. In addition, a distance from origin O to one measured-part MP is r, and a deflection angle from the +X direction to one measured-part MP with reference to the origin O is θ.

Further, in FIG. 2A, both an interval in the X direction and an interval in the Y direction between the plurality of measured-parts MP are assumed to be equal, but the interval in the X direction and the interval in the Y direction between the plurality of measured-parts MP may be unequal. In addition, the plurality of measured-parts MP does not necessarily need to be placed at a lattice point of a lattice arrangement parallel to the X direction and the Y direction, and may be placed at a random position on the substrate WF.

A position of each of the measured-parts MP is already known by design data of the pattern including the measured-part MP exposed and transferred by the previous exposure process. However, since the substrate WF is deformed in the XY in-plane direction by the machining process applied to the substrate WF after the exposure process through which the measured-part MP was formed, an actual accurate position of the measured-part MP is unknown.

Figure 2B:
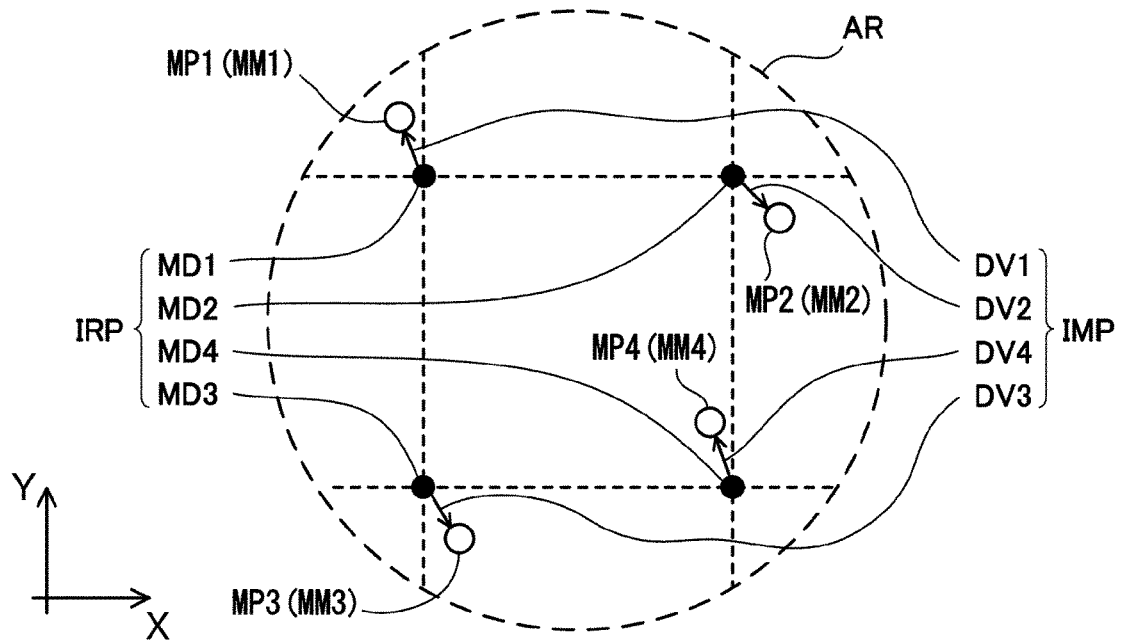
FIG. 2B is a view showing an example of the substrate.

FIG. 2B is an enlarged view showing positions of the measured-parts MP (MP1 to MP4) in an arbitrary small region AR of the substrate WF surrounded by a broken line circle shown in FIG. 2A as an example. The measured-parts MP (MP1 to MP4) are disposed at positions shifted by positions expressed by DV1 to DV4 in the in-plane direction of the substrate WF due to the deformation of the substrate WF with respect to reference positions MD1 to MD4 obtained by the above-mentioned design data, respectively. In other words, position shift amounts of the measured-parts MP (MP1 to MP4) with respect to the reference positions MD1 to MD4, i.e., the displacement vectors DV1 to DV4 express a deformation amount of the substrate WF in the XY in-plane direction.

Further, the other measured-parts MP not shown in FIG. 2B are also similarly disposed at positions shifted by positions expressed by the displacement vectors DV in the in-plane direction of the substrate WF with respect to the reference positions MD1 to MD4 due to the deformation of the substrate WF, respectively.

An X component and a Y component of the displacement vector DV are represented as ΔX and ΔY, respectively. The displacement vector $DV_j$ of the $j^{th}$ (j is an arbitrary natural number) measured-part MP is $DV_j=(\Delta X_j, \Delta Y_j)$.

The positions at which the measured-parts MP (MP1 to MP4) are disposed actually are positions measured by a position measurement part 10, which will be described below, and hereinafter, they are referred to as measurement positions MM (MM1 to MM4) of the measured-parts MP. The measurement positions MM (MM1 to MM4) of the measured-parts MP (MP1 to MP4) are positions where the displacement vectors DV (DV1 to DV4) are added to reference positions MD (MD1 to MD4), respectively. In other words, the displacement vectors DV1 to DV4 of the measured-part MP1 to MP4 are position differences between the measurement positions MM1 to MM4 and the reference positions MD1 to MD4, respectively.

The reference position MD and the measurement position MM are expressed by XY coordinate values using the origin O as a center (0, 0) as an example. Here, a relation between a position (X, Y) as XY coordinates (Descartes coordinates) of the reference position MD and a position (r, θ) as polar coordinates of the reference position MD, i.e., a distance r and a deflection angle θ from the origin O to the reference position MD of the measured-part MP is expressed by Equation (1) from Equation (4).

$$x = r \times \cos(\theta) \quad (1)$$

$$y = r \times \sin(\theta) \quad (2)$$

$$r = \sqrt{(x^2 + y^2)} \quad (3)$$

$$\theta = \tan^{-1}(Y/X) \quad (4)$$

Hereinafter, the reference position MD of the plurality of measured-parts MP is referred to as reference position information IRP generally or individually.

Hereinafter, the displacement vector DV of the plurality of measured-parts MP is referred to as measured position information IMP generally or individually.

Referring to FIG. 1 again, the measurement apparatus 1 and a substrate conveyance device 40 included in the exposure apparatus 2 will be described.

The measurement apparatus 1 includes the position measurement part 10 configured to measure a position of the measured-part MP formed on the substrate WF and surrounded by a dotted line, and a controller 15. Here, a position calculator 13, which will be described below, includes both the position measurement part 10 and the controller 15. The controller 15 further includes an analysis part 16, a display part 17, and an output part 18, which will be described below.

The position measurement part 10 has a mark detection part 11 configured to detect the measured-part MP (see FIG. 2A) on the substrate WF, an encoder head 12 configured to measure a position of the stage 30 when the mark detection part 11 detects the measured-part MP, and the position calculator 13.

The mark detection part 11 is, for example, an imaging type optical microscope, which measures a relative position shift amount in the X direction and the Y direction between a reference index in the mark detection part 11 and the measured-part MP on the substrate WF and outputs the measurement result as a signal S1. The mark detection part 11 may irradiate an irradiation pattern on the substrate WF with a laser beam or the like, and measure a position of the measured-part MP based on an intensity change of return light thereof.

Like the encoder head 23, the encoder head 12 measures a position of the stage 30 as a position of the encoder plate 32 provided on the stage 30, and outputs a position of the stage 30 as a signal S2. Further, instead of the encoder head 12, a position measurement system using a laser interferometer or a magnetic scale may be used.

The controller 15 sends a signal S3 to the stage 30 based on the signal S2 from the encoder head 12 or the signal S2a from the encoder head 23, and controls a position of the stage 30. The controller 15 sends a signal S5 to the mask stage 24 based on the signal S4 from the encoder head 28, and controls a position of the mask stage 24.

The substrate conveyance device 40 has, for example, a load guide 41 and a load arm 42 that moves along the load guide 41. The substrate conveyance device 40 is controlled by a signal S6 from the controller 15, receives the substrate WF from external equipment such as a track system or the like, and places the substrate WF at the substrate chuck part 31 on the stage 30. Further, since the substrate chuck part 31 is a member that performs the delivery operation of the substrate WF, it constitutes a part of the stage 30 and is also included in the substrate conveyance device 40.

When the substrate WF is placed on the stage 30, the controller 15 sends the signal S3 to the stage 30 based on the reference position information IRP of the plurality of measured-parts MP, and sequentially moves the stage 30 to a position where each of the plurality of measured-parts MP on the substrate WF face the mark detection part 11. In a state in which the mark detection part 11 faces each of the plurality of measured-parts MP, the controller 15 receives the signal S1 from the mark detection part 11 and the signal S2 from the encoder head 12.

The position calculator 13 that is contained in the controller 15 and that is a part of the position measurement part 10 calculates the measurement position MM or the displacement vector DV of each of the plurality of measured-parts MP on the substrate WF based on these signals. As described above, the measurement position MM of the measured-part MP is a position where the displacement vector DV is added to the reference position MD of the measured-part MP. In other words, a difference between the measurement position MM and the reference position MD of the measured-part MP is the displacement vector DV.

The analysis part 16 analyzes the measured position information IMP of the plurality of measured-parts MP measured by the position measurement part 10, i.e., the displacement vector DV of the plurality of measured-parts MP, and determines a reference function fitted to the measured position information IMP. That is, a reference function representing a deformation amount of the substrate WF in the XY in-plane direction including the plurality of measured-parts MP is determined. Then, the analysis part 16 estimates a position of a conventional pattern formed on the substrate WF based on the determined reference function.

When determining the reference function, the analysis part 16 prepares in advance a reference function that is the sum of at least one function obtained by multiplying a criterion function expressed using a first type Bessel function by a proportional coefficient. Then, an optimum value of the proportional coefficient is determined so that the reference function fits the measured position information IMP of the plurality of measured-parts MP. As the criterion function, a function represented by a first type Bessel function with respect to the reference position information IRP that is a reference position MP of the plurality of measured-parts MP formed on the substrate WF is used. Further, details of a criterion function, a reference function, and a determination method of the reference function, i.e., a determination method of a proportional coefficient will be described below.

The controller 15 may output an optimum value of a proportional coefficient and the other analysis results determined by the analysis part 16 from the output part 18 to external equipment different from the measurement apparatus 1 via a network line NW.

The controller 15 may display the optimum value of the proportional coefficient and the other analysis results determined by the analysis part 16 on the display part 17.

Further, the measurement apparatus 1 or the exposure apparatus 2 may not include at least one of the output part 18 and the display part 17.

When measurement of the measurement positions MM or the displacement vectors DV of the plurality of measured-parts MP on the substrate WF is terminated, the controller 15 sends a signal S3 to the stage 30 on which the substrate WF is placed, and moves the stage 30 to a position facing the projection optical system 22. Then, the exposure apparatus 2 moves the position of the stage 30 based on the position of the conventional pattern on the substrate WF estimated by the analysis part 16, i.e., matches the position of the conventional pattern, and exposes the pattern formed on the mask 25 on the substrate WF.

The conventional pattern on the substrate WF may be referred to as a first pattern, and a pattern formed on the mask 25 and newly exposed on the substrate WF may be referred to as a second pattern.

The first pattern may be formed in plural at different positions on the substrate WF, and in this case, the plurality of second patterns may be exposed at different positions on the substrate WF to match the plurality of first patterns, respectively.

Further, in the measurement apparatus 1 shown in FIG. 1, while the controller 15 of the measurement apparatus 1 controls the exposure apparatus 2, the controller 15 performs only the control of the measurement apparatus 1 and a controller configured to control the exposure apparatus 2 may be provided separately from the controller 15.

(Analyzing Method of Embodiment)

The analyzing method of the embodiment is provided to analyze characteristics of the measured position information IMP by fitting a reference function, which will be described, to the measured position information IMP that is measured position information of the plurality of measured-parts MP formed on the substrate WF. As the reference function, the sum of at least one function obtained by multiplying a criterion function expressed using a first type Bessel function by a proportional coefficient is used.

An optimum value of the proportional coefficient determined by the fitting of the reference function to the measured position information IMP represents a deformation amount of the substrate WF corresponding to the predetermined deformation mode among the displacement amount of the plurality of measured-parts MP from the reference positions MD (the reference position information IRP).

Hereinafter, a specific example of the analyzing method of the embodiment will be described.

In the analyzing method of the embodiment, as a criterion function that constitutes a reference function, a function using a first type Bessel function $J_m(\mu r)$ is used. Here, m is a subscript that represents an order of the first type Bessel function, and r is a distance from the origin O (center) of the substrate WF to the measured-part MP as shown in FIG. 2A. However, in order to facilitate mathematical handling, as described below, r is not treated as an actual distance, but as a value normalized to be 1 in the outer circumference of the circular substrate WF. As an example, if the measured-part MP is at the intermediate point between the origin O of the substrate WF and one arbitrary point on the outer circumference of the substrate WF, r of the measured-part MP is 0.5.

In addition, $\mu$ is a constant, which will be described below.

The criterion function is, for example, a function expressed by the following Equation (5) or Equation (6).

$$J_m(\mu_{mk}r) \times \cos(m\theta) \tag{5}$$

$$J_m(\mu_{mk}r) \times \sin(m\theta) \tag{6}$$

Here, as shown in FIG. 2A, $\theta$ is a deflection angle from the +X direction to the measured-part MP with reference to the origin O, and a value obtained by multiplying $\theta$ by an order m of the first type Bessel function $J_m$ is an argument of a cos function contained in Equation (5) or a sin function contained in Equation (6). In other words, the criterion function is expressed using, for example, a product of the first type Bessel function and a trigonometric function based on a deflection angle $\theta$ from the reference position (the origin O) to the measured-part MP.

The above-mentioned constant $\mu$ is expressed as a constant $\mu_{mk}$ obtained by adding the order m of the first type Bessel function $J_m$ and an arbitrary natural number k as subscripts in Equation (5) and Equation (6).

Figures 3A, 3B:
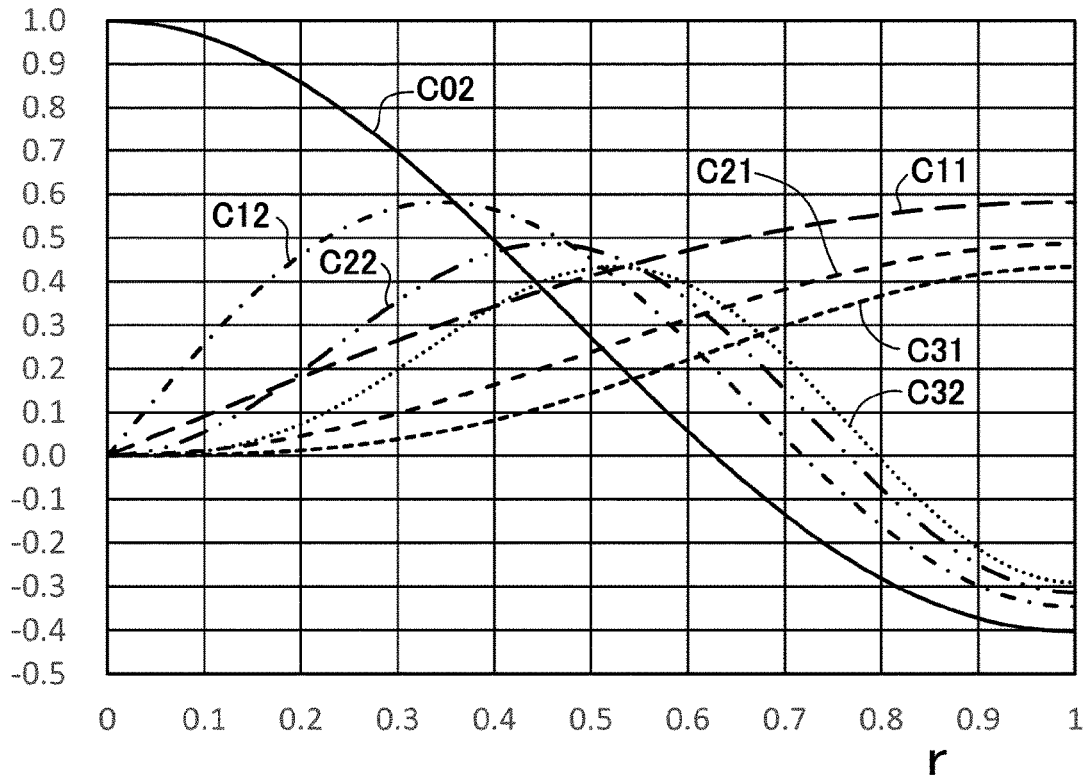
FIG. 3A is a view showing an example of a first type Bessel function included in a criterion function.
FIG. 3B is a view showing an example of the first type Bessel function included in the criterion function.

FIG. 3A and FIG. 3B are views showing an example of the first type Bessel function $J_m(\mu_{mk}r)$ contained in the criterion function. FIG. 3A is a numerical table showing some examples of values of the constant $\mu_{mk}$ determined by subscripts m and k. The value of the constant $\mu_{mk}$ shown in FIG. 3A is a value of r where $J_m(r)$ takes a $k^{th}$ extreme value (maximum value or minimum value) other than zero when r is increased from zero in a first type $m^{th}$ order of Bessel function $J_m(r)$ using r as the argument. Accordingly, $J_m(\mu_{mk}r)$ contained in Equation (5) and Equation (6) is a function that takes an extreme value when r=1.

In the numerical table of FIG. 3A, the values of the constant $\mu_{mk}$ are shown within a range of 0 to 7 for m, and 1 to a predetermined value corresponding to a value of m for k. However, the value of m of the constant $\mu_{mk}$ may be 8 or more, and the value of k may also be an arbitrary value of one or more. The value of the constant $\mu_{mk}$ can be easily calculated from the first type $m^{th}$ order of Bessel function $J_m(r)$ when m and k are determined.

Further, when m=0, an extreme value when k=1, i.e., a value of r that takes a first extreme value is zero, and it is not appropriate for use in Equation (5) and Equation (6). Here, the numerical table of FIG. 3A indicates that a horizontal line is drawn for the field with m=0 and k=1, and the numerical value of this field is inappropriate.

Further, in FIG. 3A, while the value of the constant $\mu_{mk}$ is displayed with six or more digits of significant figures, the value of the constant $\mu_{mk}$ does not necessarily have to match the value shown in FIG. 3A with an accuracy of six or more digits of significant figures. Depending on the usage situation, that is, the accuracy required for analysis, for example, it may be sufficient to match 2 digits of significant figures, or it may be sufficient to match 3 digits of significant figures.

FIG. 3B is a view in which some of the first type Bessel functions $J_m(\mu_{mk}r)$ determined by the subscripts m and k are expressed as graphs with r ranging from 0 to 1. A curve line C02 indicates a function $J_0(\mu_{02}r)$ of m=0 and k=2. Similarly, a curve line C11 indicates a function $J_1(\mu_{11}r)$, a curve line C12 indicates a function $J_1(\mu_{12}r)$, a curve line C21 indicates a function $J_2(\mu_{21}r)$, a curve line C22 indicates a function $J_2(\mu_{22}r)$, a curve line C31 indicates a function $J_3(\mu_{31}r)$, and a curve line C32 indicates a function $J_3(\mu_{32}r)$.

As described above, each function shown in FIG. 3B takes an extreme value (maximum value or minimum value) at r=1. In the curve lines C11, C21 and C31 equivalent to the function $J_m(\mu_{m1}r)$ corresponding to k=1, as r increases, it takes a first non-zero extreme value at r=1. In the curve lines C12, C22 and C32 equivalent to the function $J_m(\mu_{m2}r)$ corresponding to k=2, as r increases, it takes two non-zero extreme values at r=1.

Figure 4:
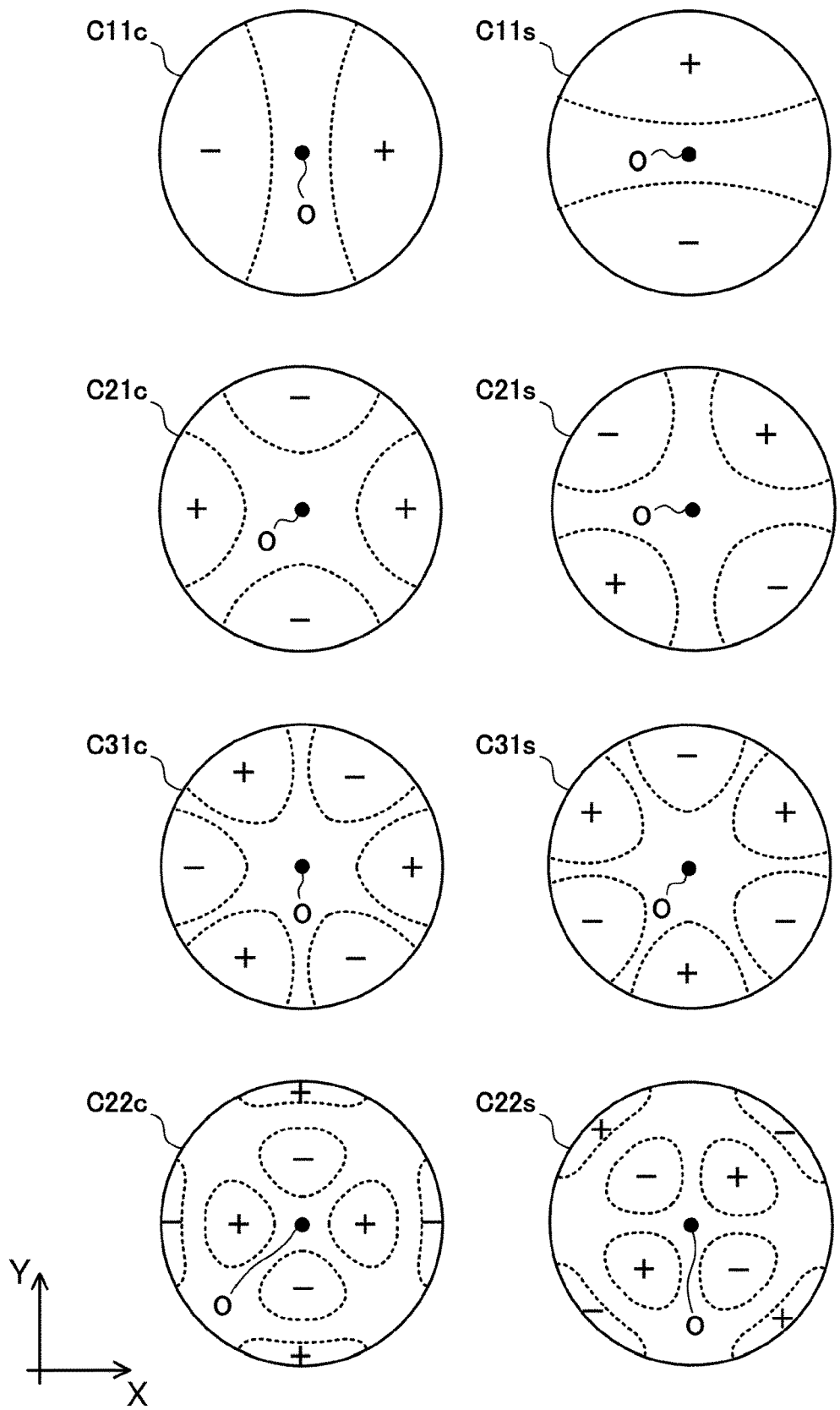
FIG. 4 is a view showing approximate values of some criterion functions.

FIG. 4 is a view showing an approximate value of a criterion function expressed by some of the subscripts m and k in the criterion functions expressed by Equation (5) or Equation (6). A criterion function C11c represents $J_1(\mu_{11}r) \times \cos(1\theta)$ at m=1 and k=1, and a criterion function C11s represents $J_1(\mu_{11}r) \times \sin(1\theta)$ at m=1 and k=1. A criterion function C21c represents $J_2(\mu_{21}r) \times \cos(2\theta)$ at m=2 and k=1, and a criterion function C21s represents $J_2(\mu_{21}r) \times \cos(2\theta)$ at m=2 and k=1.

A criterion function C31c represents $J_3(\mu_{31}r) \times \cos(3\theta)$ at m=3 and k=1, and a criterion function C31s represents $J_3(\mu_{31}r) \times \sin(3\theta)$ at m=3 and k=1. A criterion function C22c represents $J_2(\mu_{22}r) \times \cos(2\theta)$ at m=2 and k=2, and a criterion function C22s represents $J_2(\mu_{22}r) \times \cos(2\theta)$ at m=2 and k=2.

In FIG. 4, in the circle with the origin O as a center and a radius of r=1, regions where the value of each of the criterion functions (C11c to C22c, C11s to C22s) is greater than a predetermined positive value are indicated with "+," and regions with a value smaller than a predetermined negative value are indicated with "−." Regions with no "+" and "−" are regions in which a value of a criterion function is greater than the predetermined negative value or smaller than the predetermined positive value, i.e., close to zero.

As shown in FIG. 4, the criterion function given by Equation (5) and Equation (6) becomes a function whose value increases or decreases in various predetermined shapes within a circle of radius 1 by appropriately selecting the values of the subscripts m and k. Accordingly, for example, virtual deformation of the circular substrate WF in the XY in-plane direction can be expressed by one of these criterion functions (C11c to C22c, C11s to C22s, and the like) or combination of some of the criterion functions.

Hereinafter, a vector representing a virtual deformation amount of the measured-part MP of the substrate WF is expressed by the criterion function is referred to as a virtual displacement vector IV, and an X component and a Y component of the virtual displacement vector IV are referred to as $\Delta x$ and $\Delta y$, respectively. The virtual displacement vector IVj of a $J^{th}$ (j is an arbitrary natural number) measured-part MP is IVj=($\Delta xj$, $\Delta xj$).

The X component $\Delta xj$ and the Y component $\Delta yj$ of the virtual displacement vector IVj are expressed by the following Equation (7) and Equation (8) using the criterion function.

$$\Delta x_j = \sum_m \sum_k \{\alpha_{1mk} J_m(\mu_{mk} r_j) \cos(m\theta_j) + \alpha_{2mk} J_m(\mu_{mk} r_j) \sin(m\theta_j)\} \quad (7)$$

$$\Delta y_j = \sum_m \sum_k \{\alpha_{3mk} J_m(\mu_{mk} r_j) \cos(m\theta_j) + \alpha_{4mk} J_m(\mu_{mk} r_j) \sin(m\theta_j)\} \quad (8)$$

Here, $\alpha 1_{mk}$, $\alpha 2_{mk}$, $\alpha 3_{mk}$, and $\alpha 4^{mk}$ are different proportional coefficients according to the values of the subscripts m and k, respectively. Hereinafter, the proportional coefficients $\alpha 1_{mk}$, $\alpha 2_{mk}$, $\alpha 3_{mk}$, and $\alpha 4^{mk}$ are generally or individually simply referred to as a proportional coefficient $\alpha$.

In addition, rj is a distance from the origin O to the $j^{th}$ measured-part MPj, and $\theta j$ is a deflection angle from the origin O to the $j^{th}$ measured-part MPj.

As described above, in the specification, as shown by Equation (7) and Equation (8), a sum of at least one function obtained by multiplying the proportional coefficient $\alpha$ by the criterion function expressed using the first type Bessel function $J_m(\mu_{mk}r)$ is referred to as a reference function. Further, when the criterion function is one, the criterion function itself is the reference function.

Figure 5:
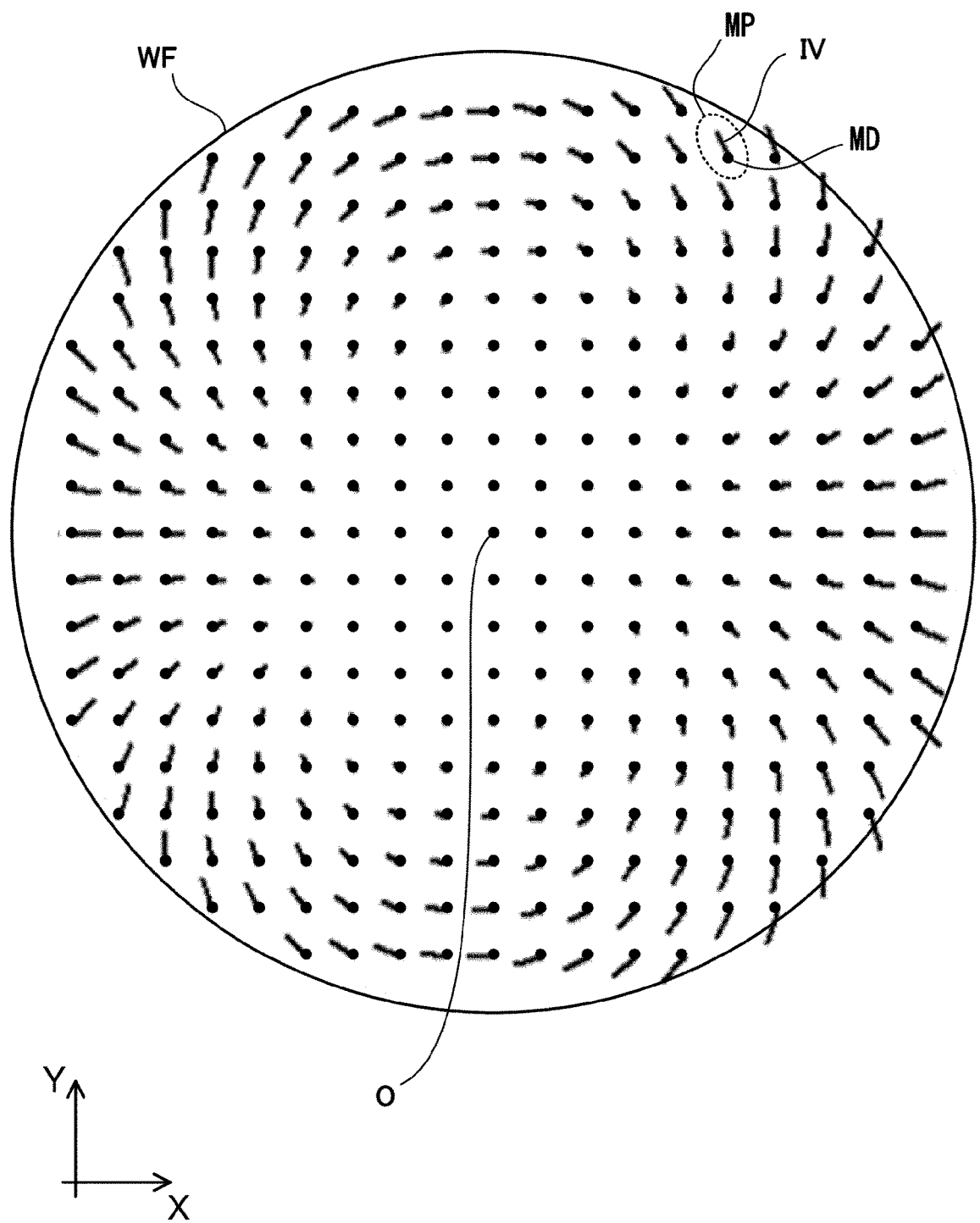
FIG. 5 is a view showing an example of a virtual deformation amount in an XY in-plane direction of the substrate, which is expressed using the criterion function.

FIG. 5 is a view showing, for example, a virtual deformation amount of the circular substrate WF in the XY in-plane direction, where a deformation amount in the X direction is expressed using the criterion function C21c and a deformation amount in a Y direction is expressed using the criterion function C21s. That is, in the example shown in FIG. 5, IVj=($\Delta xj$, $\Delta xj$) is expressed by the following Equation (9) and Equation (10).

$$\Delta x_j = \alpha J_2(\mu_{21} r_j) \times \cos(2\theta_j) \quad (9)$$

$$\Delta y_j = \alpha j_2(\mu_{21} r_j) \times \sin(2\theta_j) \quad (10)$$

Further, it is also possible to express $\Delta xj$ and $\Delta xj$ in a vector as the virtual displacement vector IVj ($\Delta xj$, $\Delta xj$), and combine Equation (9) and Equation (10) into one as in Equation (11).

$$IV_j = \begin{pmatrix} \Delta x_j \\ \Delta y_j \end{pmatrix} = \alpha J_2(\mu_{21} r_j) \times \begin{pmatrix} \cos(2\theta_j) \\ \sin(2\theta_j) \end{pmatrix} \quad (11)$$

An actual deformation amount (the displacement vector DV) of the measured-part MP of the substrate WF can be expressed approximately using the reference function by setting the value of the proportional coefficient $\alpha$ to a proper value (optimum value). The value of the proportional coefficient $\alpha$ may be determined by, for example, a least squares method. That is, in the N measured-parts MPj of the substrate WF, the optimum value of the proportional coefficient $\alpha$ may be set such that values of Ex and Ey obtained by substituting $\Delta xj$ and $\Delta yj$ of Equation (9) and Equation (10) or Equation (11) into Equation (12) and Equation (13), respectively, are minimized.

$$Ex = \Sigma_j^N (\Delta X_j - \Delta x_j)^2 \quad (12)$$

$$Ey = \Sigma_j^N (\Delta Y_j - \Delta y_j)^2 \quad (13)$$

Here, as described above, $\Delta Xj$ and $\Delta Yj$ are the X component and the Y component of the displacement vector DVj of the $j^{th}$ measured-part MP.

Alternatively, the optimum value of the proportional coefficient $\alpha$ may be set using another known method.

The reference function shown by Equation (7) and Equation (8) can be fitted to the displacement vector DV ($\Delta X$, $\Delta Y$) that is the measured position information IMP, i.e., position information measured by the plurality of measured-parts MP by setting the proper proportional coefficient α.

The value of the proportional coefficient α set to correspond to one criterion function is an index indicating how much a mode of deformation expressed by the criterion function is included in the measured position information IMP. Accordingly, amounts of various deformation modes included in the deformation of the substrate WF can be analyzed by calculating the proportional coefficient α corresponding to each of the criterion functions.

Further, the reference function expressed by Equation (7) and Equation (8) is expressed by a vector with Δxj and Δxj as the virtual displacement vector IVj (Δxj, Δxj) like the above-mentioned Equation (11), and can also be written as Equation (15).

$$IV_j = \begin{pmatrix} \Delta x_j \\ \Delta y_j \end{pmatrix} = \sum_m \sum_k \left[ J_m(\mu_{mk} r_j) \times \left\{ \beta_{1mk} \begin{pmatrix} \cos(m\theta_j) \\ \sin(m\theta_j) \end{pmatrix} + \beta_{2mk} \begin{pmatrix} \sin(m\theta_j) \\ -\cos(m\theta_j) \end{pmatrix} + \beta_{3mk} \begin{pmatrix} \cos(m\theta_j) \\ -\sin(m\theta_j) \end{pmatrix} + \beta_{4mk} \begin{pmatrix} \sin(m\theta_j) \\ \cos(m\theta_j) \end{pmatrix} \right\} \right] \quad (15)$$

In Equation (15), $\beta_{1mk}$, $\beta_{2mk}$, $\beta_{3mk}$, and $\beta_{4mk}$ are proportional coefficients different according to values of the subscripts m and k, like $\alpha_{1mk}$, $\alpha_{2mk}$, $\alpha_{3mk}$, and $\alpha_{4mk}$ of Equations (7) and (8). Hereinafter, the proportional coefficients $\beta_{1mk}$, $\beta_{2mk}$, $\beta_{3mk}$, and $\beta_{4mk}$ are generally or individually simply referred to as the proportional coefficient β.

Further, in Equation (15), when m=0, cos(mθ) is always 1, and sin(mθ) is always 0. For this reason, the proportional coefficient $\beta_{10k}$ and the proportional coefficient $\beta_{30k}$ have the same sign and overlap each other, and the proportional coefficient $\beta_{20k}$ and the proportional coefficient $\beta_{40k}$ have opposite signs and overlap each other. Accordingly, when m=0, it is appropriate to treat the proportional coefficient $\beta_{20k}$ and the proportional coefficient $\beta_{30k}$ as 0.

Further, even when disclosed as in Equation (15), the reference function is still the sum of at least one function obtained by multiplying the criterion function expressed using the first type Bessel function by the proportional coefficient.

The actual deformation amount (the displacement vector DV) of the measured-part MP of the substrate WF can be expressed approximately using the function including one or more reference function expressed by Equation (15) by setting the value of the proportional coefficient β of Equation (15) to a proper value. For example, a β value of the proportional coefficient may be determined by the above-mentioned least squares method, like the α value of the proportional coefficient.

Further, when the proportional coefficients α and β of the reference function expressed by Equation (7) and Equation (8) or Equation (15) are set, values of the proportional coefficients α and β corresponding to the subscripts m and k of the predetermined values may be determined as zero. In other words, when the proportional coefficients α and β are determined, it is not necessary to calculate the proportional coefficients α and β corresponding to the criterion functions corresponding to all combinations of the subscripts m and k. To take it to the extreme, as shown in Equation (9) to Equation (11), for only one reference function consisting of one combination of the subscripts m and k, the values of the proportional coefficients α and β corresponding thereto may be determined.

Hereinafter, in the criterion functions included in the reference function expressed by Equation (15), some criterion functions that are important when the actual deformation of the substrate WF is analyzed and the proportional coefficients corresponding thereto are exemplified. When the substrate WF is analyzed, for at least one of the criterion functions exemplified below, it is preferable to determine the value of the proportional coefficient β corresponding thereto.

In the first example, the subscripts are m=2 and k=1, and there are two criterion functions, i.e., a criterion function corresponding to the proportional coefficient $\beta_{1mk}$ and a criterion function corresponding to the proportional coefficient $\beta_{2mk}$ in Equation (15). In order to make it easier to determine the correspondence with Equation (15), the results obtained by multiplying the criterion functions by the proportional coefficient $\beta_{121}$ or the proportional coefficient $\beta_{221}$ are shown by Equation (16) and Equation (17), respectively.

$$\beta_{121} J_2(\mu_{21} r_1) \times \begin{pmatrix} \cos(2\theta_j) \\ \sin(2\theta_j) \end{pmatrix} \quad \text{式 (16)}$$

$$\beta_{221} J_2(\mu_{21} r_j) \times \begin{pmatrix} \sin(2\theta_j) \\ -\cos(2\theta_j) \end{pmatrix} \quad \text{式 (17)}$$

Among these, the deformation of the substrate WF expressed by Equation (16) is the deformation shown in FIG. 5 described above.

In the second example, the subscripts are m=2 and k=2, and there are two criterion functions, i.e., a criterion function corresponding to the proportional coefficient $\beta_{121}$ and a criterion function corresponding to the proportional coefficient $\beta_{2mk}$ in Equation (15). In order to make it easier to determine the correspondence with Equation (15), the results obtained by multiplying the criterion functions by the proportional coefficient $\beta_{122}$ or $\beta_{222}$ are shown in Equation (18) and Equation (19), respectively.

$$\beta_{122} J_2(\mu_{22} r_j) \times \begin{pmatrix} \cos(2\theta_j) \\ \sin(2\theta_j) \end{pmatrix} \quad \text{式 (18)}$$

$$\beta_{222} J_2(\mu_{22} r_j) \times \begin{pmatrix} \sin(2\theta_j) \\ -\cos(2\theta_j) \end{pmatrix} \quad \text{式 (19)}$$

In the third example, there are two criterion functions, i.e., a criterion function corresponding to the proportional coefficient $\beta_{1mk}$ in Equation (15) when the subscripts are m=1 and k=2, and, a criterion function corresponding to the proportional coefficient $\beta_{1mk}$ in Equation (15) when the subscripts are m=1 and k=3. In order to make it easier to determine the correspondence with Equation (15), the results obtained by multiplying these criterion functions by the proportional coefficient $\beta_{112}$ or the proportional coefficient $\beta_{113}$ are shown in Equation (20) and Equation (21), respectively.

$$\beta_{112} J_1(\mu_{12} r_j) \times \begin{pmatrix} \cos(\theta_j) \\ \sin(\theta_j) \end{pmatrix} \quad \text{式 (20)}$$

-continued $$\beta_{113}J_1(\mu_{13}r_j) \times \begin{pmatrix} \cos(\theta_j) \\ \sin(\theta_j) \end{pmatrix} \quad \text{式 (21)}$$

In the fourth example, the subscripts are m=2 and k=1, and there are two criterion functions, i.e., a criterion function corresponding to the proportional coefficient $\beta3_{mk}$ and a criterion function corresponding to the proportional coefficient $\beta4_{mk}$ in Equation (15). In order to make it easier to determine the correspondence with Equation (15), the results obtained by multiplying these criterion functions by the proportional coefficient $\beta3_{21}$ and the proportional coefficient $\beta4_{21}$ corresponding thereto are shown in Equation (22) and Equation (23), respectively.

$$\beta_{321}J_2(\mu_{21}r_j) \times \begin{pmatrix} \cos(2\theta_j) \\ -\sin(2\theta_j) \end{pmatrix} \quad \text{式 (22)}$$

$$\beta_{421}J_2(\mu_{21}r_j) \times \begin{pmatrix} \sin(2\theta_j) \\ \cos(2\theta_j) \end{pmatrix} \quad \text{式 (23)}$$

Further, the plurality of criterion functions (C21c, C21s, and the like) that set the proportional coefficients $\alpha$ and $\beta$ may be selected to become functions perpendicular to each other in a circle of r≤1 using the origin O as a center. For example, the criterion function C21c and the criterion function C21s are perpendicular to each other because the value obtained by integrating the product in the circle of r≤1 using the origin O as the center becomes zero.

In addition, in the plurality of first type Bessel functions $J_m(\mu_{mk}r)$ included in the plurality of criterion functions that set the proportional coefficients $\alpha$ and $\beta$, at least some or all of the subscripts m and k that differ may be perpendicular to each other within a circle of r≤1 using the origin O as the center. In other words, the reference function may include two or more criterion functions expressed by two or more first type Bessel functions perpendicular to each other in the surface (r≤1) of the substrate WF.

Further, a state in which the two first type Bessel functions $J_m(\mu_{mk}r)$ are perpendicular to each other is expressed by a state in which the value obtained by integrating the product of the two first type Bessel functions $J_m(\mu_{mk}r)$ within a circle of r≤1 using the origin O as the center becomes zero. In other words, a state in which the two first type Bessel functions $J_m(\mu_{mk}r)$ are perpendicular to each other is expressed by a state in which an inner product of the two first type Bessel functions $J_m(\mu_{mk}r)$ when integrated within a circle of r≤1 using the origin O as the center becomes zero.

Further, in determination of the optimum values of the proportional coefficients $\alpha$ and $\beta$, the remained position information that is the position information, from which a positional shift amount according to a translational shift, rotation, and uniform expansion and contraction of the substrate WF is removed from the measured position information (the displacement vector DV) of the plurality of measured-parts MP may be used as the measured position information IMP.

Here, the calculation of the positional shift amount according to the translational shift, the rotation and the uniform expansion and contraction of the substrate WF can be performed using general mathematical formulae shown in Equation (24) to Equation (26).

$$\begin{pmatrix} \varepsilon x_j \\ \varepsilon y_j \end{pmatrix} = \begin{pmatrix} a & b \\ c & d \end{pmatrix}\begin{pmatrix} X_j \\ Y_j \end{pmatrix} + \begin{pmatrix} e \\ f \end{pmatrix} - \begin{pmatrix} X_j \\ Y_j \end{pmatrix} \quad (24)$$

$$Lx = \sum_{j}^{N}(\Delta X_j - \varepsilon x_j)^2 \quad (25)$$

$$Ly = \sum_{j}^{N}(\Delta Y_j - \varepsilon y_j)^2 \quad (26)$$

Here, in Equation (24), a is a parameter expressing a uniform expansion and contraction of the substrate WF in the X direction, d is a parameter expressing a uniform expansion and contraction in the Y direction, b and c are parameters expressing rotations of the substrate WF, e is a parameter expressing a translational shift of the substrate WF in the X direction, and y is a parameter expressing a translational shift in the Y direction. In addition, Xj and Yj are an X position and a Y position of the reference position MD of the j$^{th}$ measured-part MP, respectively, and N is the number of the measured-parts MP. Then, $\varepsilon$xj and $\varepsilon$yj express a shift amount of the X position and a shift amount of the Y position from the reference position MD of the j$^{th}$ measured-part MPj according to the translational shift, the rotation, and the uniform expansion and contraction of the substrate WF determined by the parameters a to f.

The values of the parameters a to f are determined such that, for example, values of Lx and Ly are minimized using a least squares method by substituting $\varepsilon$xj and $\varepsilon$yj expressed by Equation (24) into Equation (25) and Equation (26), respectively. Then, $\varepsilon$xj and $\varepsilon$yj for each of the N measured-parts MP are calculated by substituting the values of the determined parameters a to f into Equation (22).

The remained position information that is the position information, from which the positional shift amounts ($\varepsilon$xj, $\varepsilon$yj) according to the translational shift, the rotation, and the uniform expansion and contraction of the substrate WF are removed, is calculated as ($\Delta$Xj-$\varepsilon$xj, $\Delta$Yj-$\varepsilon$yj) from the measured displacement vector DVj ($\Delta$Xj, $\Delta$Yj) of the jth measured-part MPj.

As described above, as the measured position information IMP that is the target of analysis, the analysis may be performed using the remained position information ($\Delta$Xj-$\varepsilon$xj, $\Delta$Yj-$\varepsilon$yj), instead of the measured position information (the displacement vector DV) of the plurality of measured-parts MP.

(Variant of Analyzing Method)

Hereinafter, a variant of an analyzing method will be described. However, the variant of the analyzing method has most of the same configurations as the analyzing method of the embodiment described above, so the differences will be described below. In the analyzing method of the embodiment, the first type Bessel functions that constitute the criterion function were all assumed to have extreme values at r=1. On the other hand, in the analyzing method of the variant, the first type Bessel functions that constitute the criterion function differ in that they all take 0 at r=1.

In the analyzing method of the variant, as the criterion function that constitutes the reference function, a function using the first type Bessel function $J_m(\lambda_{mk}r)$ is used. Here, $\lambda_{mk}$ is a constant to which the order m and the arbitrary natural number k of the first type Bessel function $J_m$ are added as subscripts, like $\mu_{mk}$ in the analyzing method of the embodiment.

The criterion function used in the analyzing method of the variant is, for example, a function expressed by the next Equation (27) or Equation (28).

[Math. 27]

$$J_m(\lambda_{mk}r) \times \cos(m\theta) \quad (27)$$

[Math. 28]

$$J_m(\lambda_{mk}r) \times \sin(m\theta) \qquad (28)$$

Figures 6A, 6B:
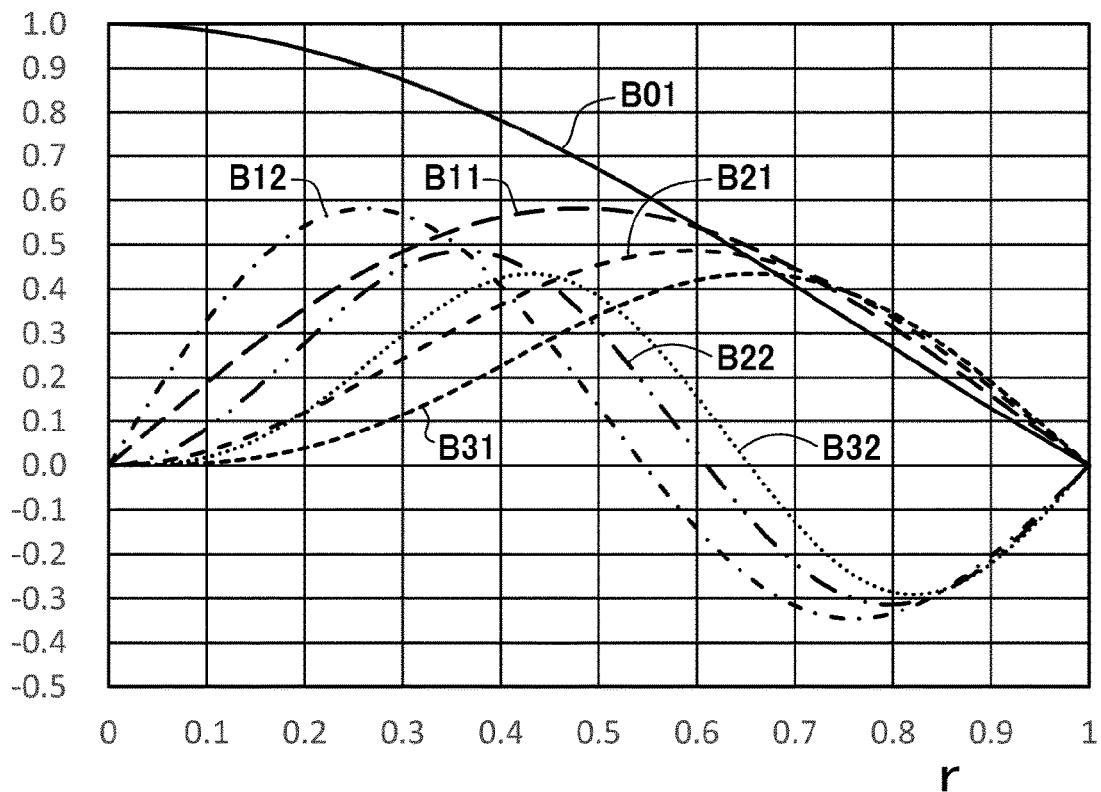
FIG. 6A is a view showing another example of the first type Bessel function included in the criterion function.
FIG. 6B is a view showing another example of the first type Bessel function included in the criterion function.

FIG. 6A and FIG. 6B are views showing examples of the first type Bessel function $J_m(\lambda_{mk}r)$ included in the criterion function. FIG. 6A is a numerical table showing some examples of values of a constant $\lambda_{mk}$ determined by the subscripts m and k. The value of the constant $\lambda_{mk}$ shown in FIG. 6A is a value of r where $J_m(r)$ takes zero at a $k^{th}$ position when r is increased from zero (r=0 is not included) in the first type $m^{th}$ order of Bessel function $J_m(r)$ that uses r as an argument. Accordingly, $J_m(\lambda_{mk}r)$ included in Equation (27) and Equation (28) becomes a function that takes zero at r=1.

In the numerical table of FIG. 6A, a value of the constant $\lambda_{mk}$ within a range from 0 to 7 for m and from 1 to a predetermined value according to a value of m for k is shown. However, the value of m of the constant $\lambda_{mk}$ is 8 or more, and the value of k may be an arbitrary value of one or more. The value of the constant $\lambda_{mk}$ can be easily calculated from the first type $m^{th}$ order of Bessel function $J_m(r)$ when m and k are determined.

FIG. 6B is a view showing some of the first type Bessel functions $J_m(\lambda_{mk}r)$ determined by the subscripts m and k as a graph within a range of r from 0 to 1. A curve line B01 shows a function $J_0(\lambda_{01}r)$ at m=0 and k=1. Similarly, a curve line B11 shows a function $J_1(\lambda_{11}r)$, a curve line B12 shows a function $J_1(\lambda_{12}r)$, a curve line B21 shows a function $J_2(\lambda_{21}r)$, a curve line B22 shows a function $J_2(\lambda_{22}r)$, a curve line B31 shows a function $J_3(\lambda_{31}r)$, and a curve line B32 shows a function $J_3(\lambda_{32}r)$.

As described above, each function shown in FIG. 6B takes zero at r=1. In the curve lines B11, B21 and B31 equivalent to the functions $J_m(\lambda_{m1}r)$ corresponding to k=1, zero is taken first at r=1 according to an increase of r (except r=0). In the curve lines B12, B22 and B32 equivalent to the functions $J_m(\lambda_{m2}r)$ corresponding to k=2, zero is taken second at r=1 according to an increase of r (except r=0).

In the analyzing method of the variant, as the reference function, an expression in which the proportional coefficient $\mu_{mk}$ included in Equation (7) and Equation (8) or Equation (15) described above is replaced with the proportional coefficient $\lambda_{mk}$ may be used. Then, like the above-mentioned analyzing method of the embodiment, for example, optimum values of the proportional coefficients α and β may be determined using a least squares method.

In the analyzing method of the variant, the criterion function that constitutes the reference function is zero at r=1, that is, at the outer circumference of the substrate WF. In other words, the first type Bessel function included in the criterion function is a function that takes zero with respect to the reference position information IRP of the measured-part MP disposed on the circumferential edge of the substrate WF. For this reason, the values of the proportional coefficients α and β can be determined without much influence of deformation in the vicinity of the outer circumference of the substrate WF, i.e., influence of the displacement vector DV of the measured-part MP disposed in the vicinity of the outer circumference of the substrate WF.

Meanwhile, in the above-mentioned analyzing method of the embodiment, the extreme value is taken at a position where the first type Bessel function included in the criterion function that constitutes the reference function is r=1, i.e., the outer circumference of the substrate WF. In other words, the first type Bessel function included in the criterion function is a function that takes an extreme value with respect to the reference position information IRP of the measured-part MP disposed at the circumferential edge of the substrate WF. For this reason, at the outer circumference of the substrate WF, the change in the value of the criterion function with respect to the change in r is small. Accordingly, the values of the proportional coefficients α and β can be determined without much influence of a local change of the displacement vector DV of the measured-part MP disposed in the vicinity of the outer circumference of the substrate WF.

Further, the first type Bessel function $J_m(\kappa r)$ that constitutes the reference function does not necessarily have to be a function that takes an extreme value or 0 at r=1. That is, the proportional coefficient κ may be a value except the above-mentioned $\mu_{mk}$ or $\lambda_{mk}$.

In either the above-mentioned analyzing method of the embodiment or the analyzing method of the variant, the first type Bessel function alone may not be used as a reference function, but may be combined with another reference function. For example, it may be used in combination with a reference function using Zernike polynomial as a criterion function. In this case, fitting can be performed for low-order components using a reference function with a Zernike polynomial as a criterion function, and fitting can be performed for high-order components using a reference function with a first type Bessel function as a criterion function.

(Measuring Method of Embodiment)

Hereinafter, a measuring method of the embodiment will be described. The measuring method of the embodiment measures positions of the plurality of measured-parts MP formed on the substrate WF, and obtains the measured position information IMP of the measured-part MP, i.e., the displacement vector DV of the plurality of measured-parts MP. Then, optimum values of the proportional coefficients α and β included in the reference function expressed by Equation (7) and Equation (8) or Equation (15) are calculated by the above-mentioned analyzing method.

Since the method of measuring the position of the measured-part MP has been described in the description of the measurement apparatus and the exposure apparatus of the embodiment mentioned above, the description will not be repeated herein. In addition, since the method of calculating the optimum values of the reference function and the proportional coefficients α and β have also been described in the description of the analyzing method of the embodiment and variant, the description will not be repeated herein.

(Exposing Method of Embodiment)

Figure 7:
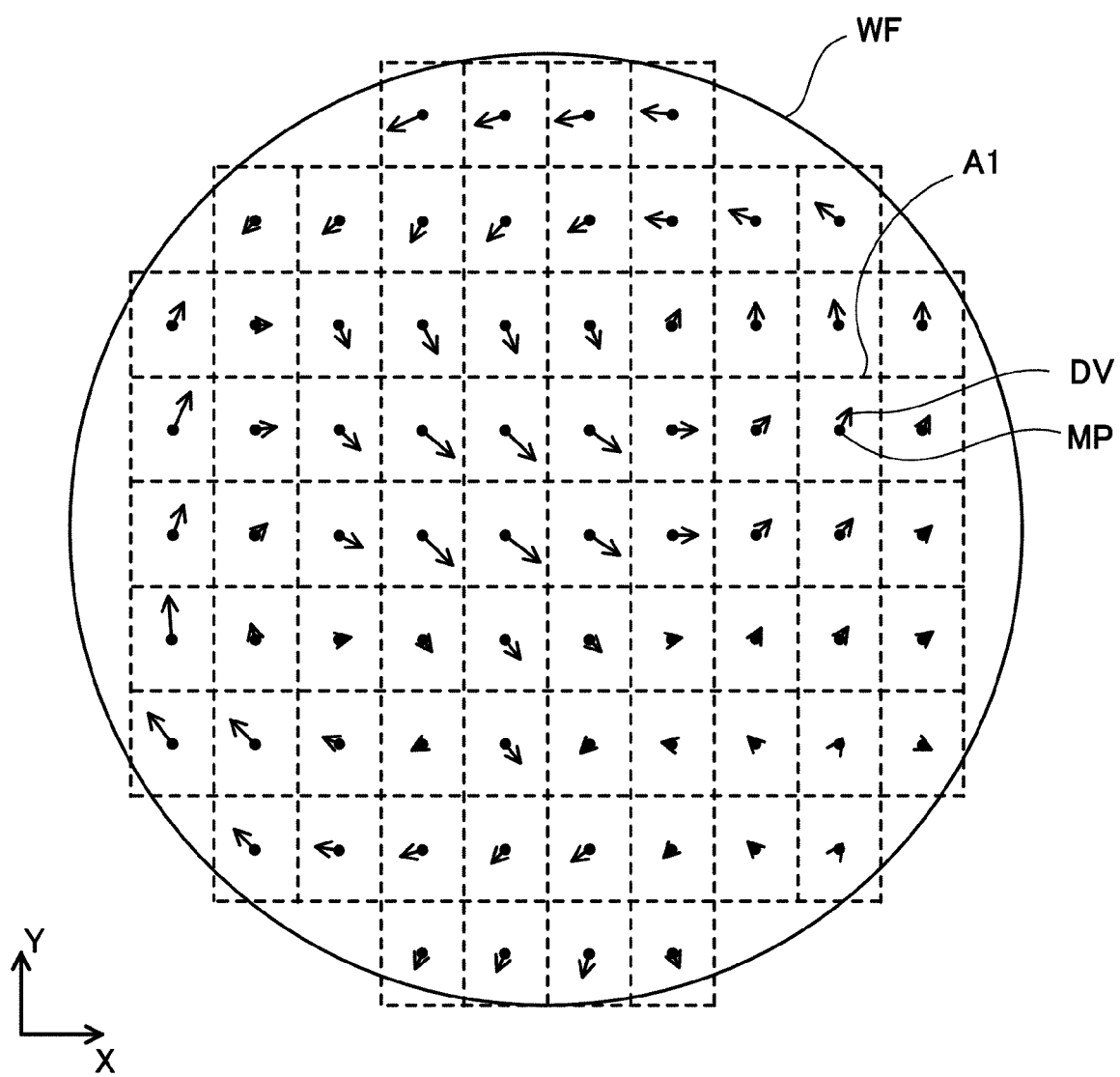
FIG. 7 is a view showing an example of a vector diagram.

Hereinafter, an exposing method of the embodiment will be described with reference to FIG. 7. FIG. 7 is a view showing the substrate WF on which a plurality of first patterns A1, outer edges of which are formed in a quadrangular shape by broken lines. A plurality of fine patterns (not shown) are formed inside the outer edge of the first pattern A1 shown by a broken line. The plurality of measured-parts MP are formed on the substrate WF at positions with predetermined positional relations with respect to the first pattern A1.

The exposing method of the embodiment measures positions of the plurality of measured-parts MP on the substrate WF using the above-mentioned measuring method of the embodiment, acquires measured position information IMP of the measured-part MP, and calculates optimum value of at least one of the proportional coefficients α and β of the above-mentioned reference functions. Then, the position of the first pattern A1 formed on the substrate WF with the predetermined positional relation with respect to the plurality of measured-parts MP is estimated based on the acquired measured position information IMP, and the optimum value of the at least one proportional coefficient.

The position of the first pattern A1 is estimated based on the reference function in which the optimum values of the proportional coefficients α and β are substituted, and the designed position data (AX, AY) of the first pattern A1. That is, the optimum values are substituted into the proportional coefficients α and β of the reference function shown by Equation (7) and Equation (8) or Equation (15). A position shift amount $\Delta xj$ in the X direction and a position shift amount $\Delta yj$ in the Y direction from the designed position are calculated (estimated) by inputting the value of the designed position (Arj, Aθj) in polar coordinates of the $j^{th}$ first pattern A1$j$ to θj and θj of the reference function.

Accordingly, the estimated position in the XY coordinates of the $j^{th}$ first pattern A1$j$ is an estimated position (AXj+$\Delta xj$, AYj+$\Delta yj$) where the above-mentioned $\Delta xj$ and $\Delta yj$ are added to the designed position (AXj, AYj) in the XY coordinates of the $j^{th}$ first pattern A1$j$.

Then, a second pattern (not shown) is exposed to align with the first pattern A1 on the substrate WF based on the estimated position of the estimated first pattern A1.

Further, after removing the positional shift amount according to the translational shift, the rotation, and the uniform expansion and contraction of the substrate WF using Equation (24) or the like, when the optimum values of the proportional coefficients α and β are determined, correction is necessary for the estimated position (AXj+$\Delta xj$, AYj+$\Delta yj$) of the first pattern A1.

In the correction, εxj and εyj are calculated by substituting the designed position (AXj, AYj) in the XY coordinates of the $j^{th}$ first pattern A1$j$ into Equation (24) to which the values of the parameters a to f determined in this way are substituted. Then, the εxj and εyj may be added to the estimated position of the first pattern A1. That is, the estimated position of the first pattern A1 after correction is an estimated position (AXj+$\Delta xj$+εxj, AYj+$\Delta yj$+εyj).

The exposing method of the embodiment can be performed using the exposure apparatus 2 of the embodiment as an example. For example, the second pattern exposed to the substrate WF in the exposing method of the embodiment is to expose a pattern original plate formed on the mask 25 to the substrate WF via the projection optical system 22.

(Added Description of Measurement Apparatus and Exposure Apparatus of Embodiment)

Additional matters regarding the measurement apparatus 1 and the exposure apparatus 2 of the embodiment will be described.

The controller 15 may display the fitting result of the measured position information IMP as a vector diagram using a reference function to which the optimum values of the proportional coefficients α and β are applied (substituted). Here, as shown in FIG. 7, the vector diagram is a view that displays the deformation amount of the plurality of measured-parts MP on the substrate WF as a vector with the reference position MD of each of the measured-parts MP as the reference (starting point). Here, the scale representing the vector may be greatly expanded compared to the scale representing the position of the measured-part MP.

The vector diagram displayed on the display part 17 may be a vector diagram that indicates a virtual deformation amount of each of the measured-parts MP calculated by the fitted reference function. Alternatively, it may be a vector diagram that indicates a difference between the actual deformation amount (the displacement vector DV) of each of the measured-parts MP and the virtual deformation amount of each of the measured-parts MP calculated by the fitted reference function.

Further, the controller 15 may obtain information regarding the processing history of the substrate WF which has been analyzed via the network line NW, and analyze correlation between the information regarding the history and the analysis result performed by the analysis part 16. For example, correlation between a processing parameter of an external processing device (etching equipment, a deposition apparatus, chemical mechanical planarization (CMP), or the like), which is used before conveyance of the substrate WF to the measurement apparatus 1 and which is different from the measurement apparatus 1, and the optimum value of the proportional coefficient determined by the analysis part 16 may be taken, feed it back to the processing device, and the processing parameter may be changed and optimized. As the processing parameter, for example, the temperature added to the substrate WF during processing in a processing device, the polishing speed in CMP, or the like, may be changed and optimized. The analysis and feedback of such correlation need not necessarily be performed by the controller 15 or the analysis part 16, but may be performed by a host computer provided separately from the measurement apparatus 1 or an external processing device.

Further, the optimal value of the proportional coefficient determined by the analysis part 16 can be continuously monitored, and a warning can be issued if it exceeds a preset threshold. Abnormalities in external processing devices can be detected by the warning. For example, it is possible to estimate the deterioration (life span) of the electrode in etching equipment. In addition, a flag may be attached to the history of the substrate WF that falls outside the threshold.

(Added Description of Exposure Apparatus of Embodiment)

Additional matters of the exposure apparatus 2 of the embodiment will be described.

The exposure apparatus 2 of the embodiment determines an operation state of the substrate conveyance device 40 (the load guide 41, the load arm 42, and the substrate chuck part 31) based on the measurement results (the proportional coefficients α and β) obtained by the measuring method of the above-mentioned embodiment. The operation state of the substrate conveyance device 40 is, for example, a moving speed of the substrate WF with respect to the substrate chuck part 31 when the substrate WF is placed at the substrate chuck part 31 on the stage 30 or a relative inclination between the substrate WF and the substrate chuck part 31.

The operation state of the substrate conveyance device 40 may be timing of generation of a holding force for holding the substrate WF on the substrate chuck part 31. Change of the timing of generation of the holding force may be change of the timing when the holding force is generated almost all over the surface of the substrate chuck part 31 with respect to the tuning of placement of the substrate WF. Alternatively, the timing of generation of the holding force in the predetermined portion of the substrate chuck part 31 may be set earlier or later than the timing of generation of the holding force in other parts.

These operating states are changed by changing the value of the device constant stored in the controller 15 or the like of the exposure apparatus 2. Accordingly, it can be said that the exposure apparatus 2 determines a device constant that defines the operation of the substrate conveyance device 40 based on the measurement result (the proportional coefficients α and β) obtained by the measuring method of the embodiment.

By changing these device constants, the state in which the substrate WF is sucked to the substrate chuck part 31 can be changed, and the state in which the substrate WF is deformed by suction can be changed. As described above, the device constant includes any one of the device constants that determines a moving speed of the substrate WF when the substrate WF is placed on the stage 30, a relative inclination between the substrate WF and the stage 30, or timing of generation of a holding force for holding the substrate WF on the stage 30.

Further, the change of the device constant may be performed before the substrate WF is removed from the substrate chuck part 31 and the substrate WF is sucked to the substrate chuck part 31 again after the proportional coefficients α and β are determined by the measuring method of the embodiment in a state in which the substrate WF is sucked to the stage 30 (the substrate chuck part 31).

When exposing one lot of substrates consisting of a predetermined number of substrates WF, the device constant determined as above for the first substrate WF may be used to expose the second and subsequent substrates WF.

Embodiment of Analysis Apparatus

An analysis part 16 included in the above-mentioned exposure apparatus 2 or measurement apparatus 2 may be incorporated in an analysis apparatus separated from the exposure apparatus 2 or the measurement apparatus 2.

Figure 8:
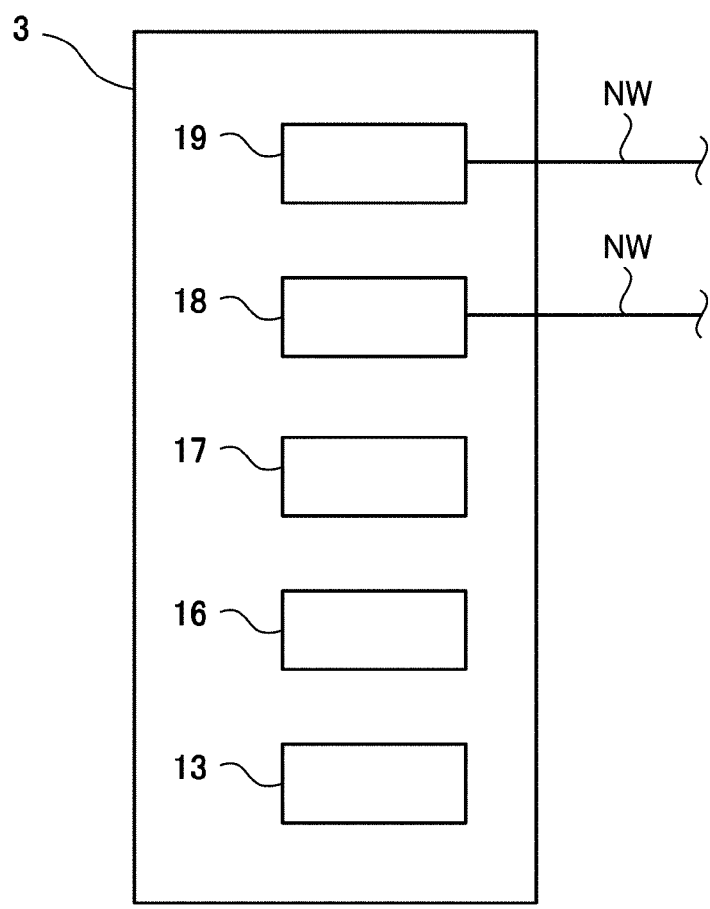
FIG. 8 is a schematic view showing a configuration of an analysis apparatus of the embodiment.

FIG. 8 is a view schematically showing a configuration of an analysis apparatus 3 of the embodiment. The analysis apparatus 3 includes an input part 19, in addition to the analysis part 16, the display part 17, the output part 18, and the position calculator 13, which were described above.

Further, in the analysis apparatus 3 configured separately from the exposure apparatus 2 or the measurement apparatus 2, at least one of the position calculator 13 and the display part 17 may not be included.

The measured position information IMP that is position information measured by the plurality of measured-parts formed on the substrate WF is input to the analysis apparatus 3 from the input part 19, and the analysis apparatus 3 outputs the optimum value calculated by the analysis part 16 from the output part 18 to the external device such as the exposure apparatus, the measurement apparatus, the display device, or the like. The measured position information IMP may be input to the input part 19 via the network line NW or via a dedicated signal line provided between the input part 19 and the external device. Output from the output part 18 to the external device may also be performed via the network line NW, or via a dedicated signal line provided between the output part 18 and the external device.

The input part 19 and the output part 18 may be configured integrally as an input/output part.

The analysis apparatus 3 may output not only the optimum value as the analysis result, but also data corresponding to the various vector diagrams described above and other processing results.

(Effects of Analyzing Method of Embodiment and Variant)

(1) The analyzing method of the embodiment or variant includes preparing the measured position information IMP that is position information of the plurality of measured-parts MP formed on the substrate WF, fitting a reference function, which is sum of at least one function obtained by multiplying the criterion function expressed using the first type Bessel function by the proportional coefficient, to the measured position information IMP, and calculating an optimum value of at least one of the proportional coefficient.

According to this above-mentioned configuration, the deformation of the substrate WF can be easily separated into deformation components corresponding to the criterion function, and the deformation amount in the deformation mode corresponding to the criterion function can be analyzed.

(Effects of Analysis Apparatus of Embodiment)

(2) The analysis apparatus 3 of the embodiment includes the input part 19 configured to input the measured position information IMP that is position information of the plurality of measured-parts formed on the substrate WF, the analysis part 16 configured to analyze the measured position information IMP of the measured-part MP that was measured by the position measurement part, and the output part 18 configured to output the analysis results including at least a calculated optimum value of a proportional coefficient to external equipment. Then, the analysis part 16 calculates an optimum value of at least one of the proportional coefficient using the analyzing method of the above-mentioned embodiment or variant.

According to this configuration, the deformation of the substrate WF can be easily separated into deformation components corresponding to the criterion function, and the deformation amount in the deformation mode corresponding to the criterion function can be analyzed.

(Effects of Measuring Method of Embodiment)

(3) The measuring method of the embodiment includes measuring positions of the plurality of measured-parts MP formed on the substrate WF, obtaining the measured position information IMP of the measured-part MP, and calculating an optimum value of at least one of the proportional coefficient in the reference function that is the sum of the at least one function obtained by multiplying the criterion function expressed using the first type Bessel function by the proportional coefficient through the analyzing method of the embodiment or variant.

According to this configuration, the deformation of the substrate WF can be measured for each deformation component corresponding to the criterion function.

(Effects of Measurement Apparatus of Embodiment)

(4) The measurement apparatus 1 of the embodiment includes the position measurement part 10 configured to measure the position of the measured-part MP formed on the substrate WF, and the analysis part 16 configured to analyze the measured position information IMP of the measured-part MP that is measured by the position measurement part 10, and the analysis part 16 calculates an optimum value of at least one of the proportional coefficient in the reference function that is the sum of the at least one function obtained by multiplying the criterion function expressed using the first type Bessel function by the proportional coefficient through the analyzing method of the embodiment or variant.

According to this configuration, the deformation of the substrate WF can be measured for each deformation component corresponding to the criterion function.

(Effects of Exposing Method of Embodiment)

(5) The exposing method of the embodiment includes measuring positions of the plurality of measured-parts MP on the substrate WF using the measuring method of the embodiment, acquiring the measured position information IMP of the measured-part, and calculating an optimum value of at least one of the proportional coefficient in the reference function that is the sum of the at least one function obtained by multiplying the criterion function expressed using the first type Bessel function by the proportional coefficient. Then, the position of the first pattern A1 formed on the substrate WF with a predetermined positional relation with respect to the plurality of measured-parts MP is estimated based on the acquired measured position information IMP and the optimum value of at least one of the proportional coefficient, and the second pattern is exposed on the substrate WF based on the estimated position of the first pattern.

According to this configuration, the second pattern can be exposed by aligning the positions to the first pattern A1 formed on the deformed substrate WF.

Effects of Exposure Apparatus of Embodiment (6) From one point of view, the exposure apparatus 2 of the embodiment includes the position measurement part 10 configured to measure a position of the measured-part MP formed on the substrate WF, and the exposure optical system 20 configured to expose a desired pattern on the substrate WF, and performs the exposing method of the embodiment.

According to this configuration, the second pattern can be exposed by aligning the positions to the first pattern A1 formed on the deformed substrate WF with a predetermined positional relation with respect to the measured-part MP.

(7) From another one point of view, the exposure apparatus 2 of the embodiment includes the stage 30 configured to place and move the substrate WF on which the measured-part MP is formed, and the substrate conveyance device 40 configured to convey the substrate WF and place the substrate WF on the stage 30, and the exposure apparatus 2 exposes a desired pattern on the substrate WF, a device constant that defines an operation of the substrate conveyance device 40 is determined based on a measurement result obtained by the measuring method of the embodiment.

According to this configuration, in a state in which the deformation of the substrate WF is reduced, the substrate WF can be placed on the stage 30, and the second pattern can be exposed by aligning the positions more with respect to the first pattern A1 formed on the substrate WF.

The present invention is not limited to the above-mentioned contents. Other aspects that can be considered within the scope of the technical scope of the present invention are also included within the scope of the present invention. This embodiment may combine all or some of the above-mentioned aspects.

What is claimed is:

1. An exposing method comprising:
   measuring positions of a plurality of measured-parts formed on a substrate and acquiring measured position information of the measured-parts;
   fitting a reference function, which is a sum of at least one function obtained by multiplying a criterion function expressed using a first type Bessel function by a proportional coefficient, to the measured position information and calculating an optimum value of at least one of the proportional coefficient;
   estimating a position of a first pattern formed on the substrate with a predetermined positional relation with respect to the plurality of measured-parts based on the acquired measured position information and the calculated optimum value of the least one proportional coefficient; and
   exposing, by way of an exposure optical system, a second pattern on the substrate based on the estimated position of the first pattern.

2. The exposing method according to claim 1, wherein the criterion function is expressed by a first type Bessel function with respect to reference position information of the plurality of measured-parts formed on the substrate.

3. The exposing method according to claim 2, wherein the criterion function is expressed by a first type Bessel function with respect to a distance from a reference position of the substrate to a measured-part of the plurality of measured-parts.

4. The exposing method according to claim 3, wherein the criterion function is expressed using a product of the first type Bessel function and a trigonometric function based on a deflection angle from the reference position to the measured-part.

5. The exposing method according to claim 3,
   wherein the first type Bessel function included in the criterion function is a function that takes an extreme value with respect to the reference position information of the measured-part, which is disposed at a circumferential edge of the substrate.

6. The exposing method according to claim 5, wherein the criterion function includes two functions expressed by any one of the following two equations as a product of an $m^{th}$ order first type Bessel function $J_m(\mu r)$ (m is a natural number), which sets a value obtained by multiplying a distance r from the reference position to the measured-part by a constant $\mu$ as an argument, and a two-dimensional vector which is constituted by a cos function and a sin function which set an angle m times a deflection angle $\theta$ from the reference position to the measured-part as an argument:

$$J_m(\mu r) \times \begin{pmatrix} \cos(m\theta) \\ \sin(m\theta) \end{pmatrix}$$

$$J_m(\mu r) \times \begin{pmatrix} \sin(m\theta) \\ -\cos(m\theta) \end{pmatrix}.$$

7. The exposing method according to claim 6, wherein the m is 2, and
   the constant $\mu$ is set such that a second-order first type Bessel function $J_2(\mu r)$ takes a first non-zero extreme value at a distance r corresponding to the circumferential edge of the substrate when the distance r is increased from zero.

8. The exposing method according to claim 6, wherein the m is 2, and
   the constant $\mu$ is set such that a second-order first type Bessel function $J_2(\mu r)$ takes a second non-zero extreme value at a distance r corresponding to the circumferential edge of the substrate when the distance r is increased from zero.

9. The exposing method according to claim 5, wherein the criterion function includes two functions expressed by any one of the following two equations, which are two functions obtained by multiplying each of (i) a first-order first type Bessel function $J_1(\mu_1 r)$ that sets a value obtained by multiplying the distance r from the reference position to the measured-part by a constant $\mu_1$ as an argument, and (ii) the first-order first type Bessel function $J_1(\mu_2 r)$ that sets a value obtained by multiplying the distance r from the reference position to the measured-part by a constant $\mu_2$ as an argument, by a two-dimensional vector constituted by a cos function and a sin function using the deflection angle $\theta$ from the reference position to the measured-part as an argument,
   the constant $\mu_1$ is set such that the first-order first type Bessel function $J_1(\mu_1 r)$ takes a second non-zero extreme value at a distance r corresponding to the circumferential edge of the substrate when the distance r is increased from zero, and
   the constant $\mu_2$ is set such that the first-order first type Bessel function $J_1(\mu_2 r)$ takes a third non-zero extreme value at a distance r corresponding to the circumferential edge of the substrate when the distance r is increased from zero:

$$J_1(\mu_1 r) \times \begin{pmatrix} \cos(\theta) \\ \sin(\theta) \end{pmatrix}$$

$$J_1(\mu_2 r) \times \begin{pmatrix} \cos(\theta) \\ \sin(\theta) \end{pmatrix}.$$

10. The exposing method according to claim 5, wherein the criterion function includes two functions expressed by any one of the following two equations as a product of a second-order first type Bessel function $J_2(\mu r)$ that sets a value obtained by multiplying a distance r from the reference position to the measured-part by the constant $\mu$ as an argument, and a two-dimensional vector which is constituted by a cos function and a sin function that sets an angle two times a deflection angle $\theta$ from the reference position to the measured-part as an argument, and the constant $\mu$ is set such that the second-order first type Bessel function $J_2(\mu r)$ takes a first non-zero extreme value at a distance r corresponding to the circumferential edge of the substrate when the distance r is increased from zero:

$$J_2(\mu r) \times \begin{pmatrix} \cos(2\theta) \\ -\sin(2\theta) \end{pmatrix}$$

$$J_2(\mu r) \times \begin{pmatrix} \sin(2\theta) \\ \cos(2\theta) \end{pmatrix}.$$

11. The exposing method according to claim 2, wherein the first type Bessel function included in the criterion function is a function that becomes zero with respect to the reference position information of a measured-part of the plurality of measured-parts disposed at a circumferential edge of the substrate.

12. The exposing method according to claim 1, wherein the reference function includes two or more criterion functions expressed by two or more of the first type Bessel functions perpendicular to each other in a surface of the substrate.

13. The exposing method according to claim 1, wherein the measured position information is remaining position information that is position information obtained by removing a positional shift amount according to a translational shift, rotation, and uniform expansion and contraction of the substrate from the measurement position information of the plurality of measured-parts.

14. An analysis apparatus comprising:
an input part configured to input measured position information that is position information of a plurality of measured-parts formed on a substrate;
an analysis part configured to analyze the measured position information of the measured-part that was measured by a position measurement part; and
an output part configured to output an analysis result including at least a calculated optimum value of a proportional coefficient to external equipment,
wherein the analysis part calculates an optimum value of at least one of the proportional coefficient using the exposing method according to claim 1.

15. An exposure apparatus comprising:
a stage configured to place and move a substrate on which a plurality of measured-parts are formed; and
a substrate conveyance device configured to convey the substrate and place the substrate on the stage, the exposure apparatus exposing a desired pattern on the substrate,
wherein a device constant that defines an operation of the substrate conveyance device is determined by:
measuring positions of the plurality of measured-parts formed on the substrate and obtaining measured position information of the measured-parts; and
fitting a reference function, which is a sum of at least one function obtained by multiplying a criterion function expressed using a first type Bessel function by a proportional coefficient, to the measured position information and calculating an optimum value of at least one of the proportional coefficient.

16. The exposure apparatus according to claim 15, comprising:
a position measurement part configured to measure the positions of the plurality of measured-parts formed on the substrate; and
an exposure optical system configured to expose the desired pattern on the substrate.

17. The exposure apparatus according to claim 15, comprising:
a position measurement part configured to measure the positions of the plurality of measured-parts formed on the substrate; and
an analysis part configured to analyze the measured position information,
wherein the analysis part calculates the optimum value of the at least one proportional coefficient.

18. The exposure apparatus according to claim 17, comprising an output part configured to output an analysis result including at least the calculated optimum value of the at least one proportional coefficient.

19. The exposure apparatus according to claim 17, comprising a display part configured to display an analysis result including at least the calculated optimum value of the at least one proportional coefficient.

20. The exposure apparatus according to claim 19, wherein the display part displays a fitting result using the reference function to which the calculated optimum value of the at least one proportional coefficient is applied as a vector diagram.

21. The exposure apparatus according to claim 15, wherein the device constant includes any one of a moving speed of the substrate when the substrate is placed on the stage, a relative inclination between the substrate and the stage, and timing of generating a holding force to hold the substrate on the stage.

* * * * *